US011318625B2

(12) United States Patent
Wada et al.

(10) Patent No.: US 11,318,625 B2
(45) Date of Patent: May 3, 2022

(54) RING FRAME HOLDING MECHANISM

(71) Applicant: DISCO CORPORATION, Tokyo (JP)

(72) Inventors: Masahiro Wada, Tokyo (JP); Naohisa Watanabe, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 350 days.

(21) Appl. No.: 16/596,898

(22) Filed: Oct. 9, 2019

(65) Prior Publication Data

US 2020/0114525 A1   Apr. 16, 2020

(30) Foreign Application Priority Data

Oct. 10, 2018   (JP) .............................. JP2018-191690

(51) Int. Cl.
    *B25J 15/06*     (2006.01)
    *F16B 47/00*     (2006.01)

(52) U.S. Cl.
    CPC ........... *B25J 15/0616* (2013.01); *F16B 47/00* (2013.01)

(58) Field of Classification Search
CPC . B25J 15/0616; F16B 47/00; H01L 21/67132; H01L 21/68735; H01L 21/6838; H01L 21/304; H01L 21/67092; H01L 21/68721; H01L 21/67017; H01L 21/67259; H01L 21/6836
USPC .................................................... 248/205.9
See application file for complete search history.

(56) References Cited

U.S. PATENT DOCUMENTS

| | | | | |
|---|---|---|---|---|
| 2019/0326174 A1* | 10/2019 | Zhao | ...................... | H01L 21/304 |
| 2020/0114525 A1* | 4/2020 | Wada | .................. | H01L 21/6838 |
| 2020/0266102 A1* | 8/2020 | Harada | .................... | H01L 21/78 |
| 2020/0328117 A1* | 10/2020 | Harada | ................. | H01L 21/268 |
| 2021/0066111 A1* | 3/2021 | Zhao | ...................... | H01L 21/268 |
| 2021/0066129 A1* | 3/2021 | Miyata | .................. | H01L 21/681 |
| 2021/0082735 A1* | 3/2021 | Wada | .................. | H01L 21/6838 |
| 2021/0118737 A1* | 4/2021 | Harada | ............. | H01L 21/67092 |
| 2021/0229228 A1* | 7/2021 | Yamahata | ........... | H01L 21/6838 |
| 2021/0287926 A1* | 9/2021 | Eto | ..................... | H01L 21/6838 |

FOREIGN PATENT DOCUMENTS

| | | |
|---|---|---|
| JP | 2011036968 A | 2/2011 |
| JP | 2013082045 A | 5/2013 |

* cited by examiner

*Primary Examiner* — Muhammad Ijaz
(74) *Attorney, Agent, or Firm* — Greer, Burns & Crain, Ltd.

(57) ABSTRACT

A ring frame holding mechanism holds under suction a lower surface of a ring frame when the ring frame is set at a target position, by using a positioning unit. In positioning the ring frame, air is discharged through a suction cup in a table to thereby form an air layer between the upper surface of the table and the lower surface of the ring frame. This air layer brings the ring frame and the suction cup into a noncontact state and also depresses the suction cup downward so that the upper end of the suction cup becomes flush with the table. Accordingly, the ring frame can be floated over the suction cup, so that the ring frame can be easily moved horizontally. That is, the ring frame can be easily set to the target position and the occurrence of improper positioning can be suppressed.

6 Claims, 6 Drawing Sheets

RING FRAME HOLDING MECHANISM

BACKGROUND OF THE INVENTION

Field of the Invention

The present invention relates to a ring frame holding mechanism.

Description of the Related Art

A tape mounter is used to attach a dicing tape to a ring frame and a wafer, thereby uniting the wafer and the ring frame through the dicing tape. The tape mounter includes ring frame holding means holding under suction the lower surface of the ring frame, where the ring frame has an inner diameter larger than the diameter of the wafer. That is, the ring frame has a circular inside opening having a diameter larger than the diameter of the wafer. The tape mounter further includes wafer holding means holding under suction the lower surface of the wafer, where the wafer is located in the inside opening of the ring frame held by the ring frame holding means. The tape mounter further includes attaching means attaching the dicing tape to the upper surface of the ring frame held by the ring frame holding means and the upper surface of the wafer held by the wafer holding means. In attaching the dicing tape, the center of the inside opening of the ring frame is set so as to collide with the center of the wafer.

The outer circumference of the ring frame is formed with a pair of first flat surfaces opposed in parallel to each other and a pair of second flat surfaces opposed in parallel to each other, the direction of opposition of the first flat surfaces being perpendicular to the direction of opposition of the second flat surfaces.

To make the center of the wafer coincide with the center of the inside opening of the ring frame, the ring frame holding means includes positioning means adapted to abut against the first flat surfaces and/or the second flat surfaces of the ring frame, thereby setting the ring frame to a target position (see Japanese Patent Laid-open No. 2013-082045 and Japanese Patent Laid-open No. 2011-036968). The ring frame holding means further includes at least four suction cups for holding the ring frame positioned by the positioning means. These four suction cups are arranged at equal intervals along a circle around the center of the positioned ring frame.

The reason for using the suction cups is to prevent damage to the lower surface of the ring frame and also to reliably hold under suction the ring frame having a slight warp.

SUMMARY OF THE INVENTION

The ring frame is placed on the suction cups, so that frictional force between each suction cup and the ring frame hinders easy movement of the ring frame in a horizontal direction in positioning the ring frame, causing difficulty in the positioning of the ring frame. To cope with this problem, air may be discharged from each suction cup to thereby float the ring frame over each suction cup. However, there is a possibility that the flows of air discharged from all the four suction cups arranged below the lower surface of the ring frame become out of balance. In this case, it is difficult to float the ring frame over all the four suction cups. That is, in the case where at least one of the four suction cups is kept in contact with the ring frame, the horizontal movement of the ring frame is hindered by the frictional force between this suction cup and the ring frame, causing difficulty in the positioning of the ring frame.

It is therefore an object of the present invention to provide a ring frame holding mechanism which can facilitate the positioning of the ring frame to be held by suction cups.

In accordance with an aspect of the present invention, there is provided a ring frame holding mechanism for holding under suction a lower surface of a ring frame in a condition where the ring frame is set at a target position by using positioning means, the outer circumference of the ring frame being formed with four flat surfaces including a pair of first flat surfaces opposed in parallel to each other and a pair of second flat surfaces opposed in parallel to each other, a direction of opposition of the first flat surfaces being perpendicular to a direction of opposition of the second flat surfaces, the positioning means being adapted to abut against at least one of the pair of first flat surfaces and the pair of second flat surfaces. The ring frame holding mechanism includes a table having an upper surface for mounting the lower surface of the ring frame, the table including a recess formed on the upper surface of the table, the recess having an upper opening; a flexible suction cup provided in the recess so as to be exposed to the upper opening of the recess; a vacuum source for applying a vacuum to the suction cup; a suction passage for connecting the suction cup to the vacuum source; a first valve provided in the suction passage; an air source for supplying air to the suction cup; an air supply passage for connecting the suction cup to the air source; and a second valve provided in the air supply passage; the suction cup having an upper end normally projecting upward from the upper opening of the recess, the upper end of the suction cup capable of being stored into the recess by being depressed downward; wherein when the first valve is closed and the second valve is opened to supply air from the air source to the suction cup and discharge air from the suction cup, an air layer is formed between the upper surface of the table and the lower surface of the ring frame to thereby bring the ring frame and the upper end of the suction cup into a non-contact state and to also depress the upper end of the suction cup downward, so that the upper end of the suction cup becomes flush with the upper surface of the table, and the ring frame is set to the target position by the positioning means in such a floating condition of the ring frame; and when the second valve is closed and the first valve is opened to apply the vacuum from the vacuum source to the suction cup, the ring frame is held on the upper end of the suction cup under suction.

Preferably, the ring frame holding mechanism further includes a cylindrical bellows provided in the recess for supporting the suction cup; wherein when the first valve is opened to hold under suction the ring frame on the upper end of the suction cup, the upper end of the suction cup is depressed downward by the lower surface of the ring frame, and the pressure inside the cylindrical bellows is reduced to a vacuum to produce a pressure difference between the reduced pressure inside the cylindrical bellows and the atmospheric pressure outside the cylindrical bellows, so that the cylindrical bellows is contracted by the atmospheric pressure, and the suction cup is accordingly fully stored into the recess, thereby allowing the upper surface of the table to support the lower surface of the ring frame.

According to the ring frame holding mechanism of the present invention, the following effect can be exhibited. In positioning the ring frame, air is discharged from the suction cup to thereby form an air layer between the upper surface of the table and the lower surface of the ring frame. This air layer brings the ring frame the upper end of the suction cup into a noncontact state and also depresses the suction cup downward so that the upper end of the suction cup becomes flush with the upper surface of the table. Accordingly, the ring frame can be floated over the upper end of the suction cup, so that the ring frame can be easily moved horizontally by the positioning means. That is, the ring frame can be easily set to the target position and the occurrence of improper positioning can be suppressed.

In the case that the ring frame holding mechanism further includes the cylindrical bellows for supporting the suction cup, the following effect can be further exhibited. When the ring frame is held under suction by the suction cup, the suction cup is fully stored into the recess, so that the lower surface of the ring frame is supported on the upper surface of the table. Accordingly, for example, in attaching a dicing tape to the upper surface of the ring frame by using an attaching roller, the dicing tape and the ring frame can be interposed between the attaching roller and the upper surface of the table. As a result, the dicing tape can be attached to the upper surface of the ring frame easily and firmly.

The above and other objects, features, and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1:
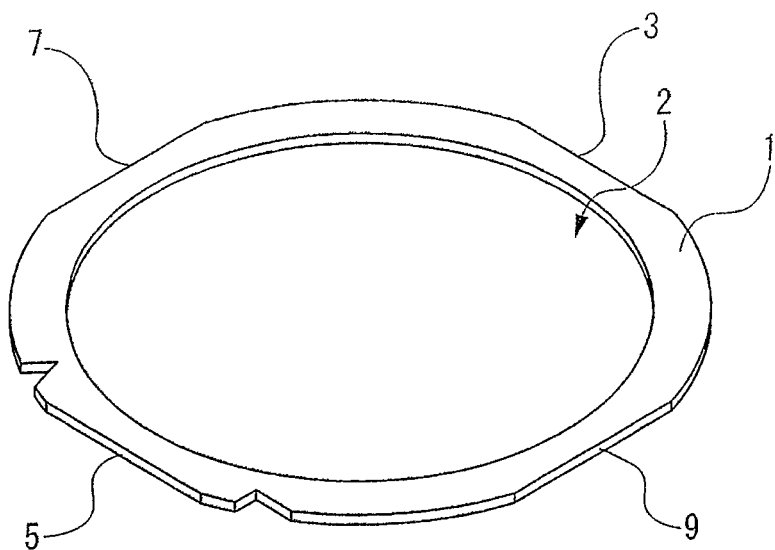
FIG. 1 is a perspective view of a ring frame.

There will now be described a ring frame to be handled by a ring frame holding mechanism according to a preferred embodiment of the present invention. Referring to FIG. 1, a ring frame 1 is illustrated. The ring frame 1 has a central opening 2, a pair of first flat surfaces 3 and 5 opposed in parallel to each other, and a pair of second flat surfaces 7 and 9 opposed in parallel to each other. The direction of opposition of the first flat surfaces 3 and 5 is perpendicular to the direction of opposition of the second flat surfaces 7 and 9. The first flat surfaces 3 and 5 extend in a first direction, and the second flat surface 7 and 9 extend in a second direction perpendicular to the first direction. All of the four flat surfaces 3, 5, 7, and 9 are formed on the outer circumference of the ring frame 1, and these flat surfaces 3, 5, 7, and 9 function as reference surfaces in positioning the ring frame 1.

Figure 2:
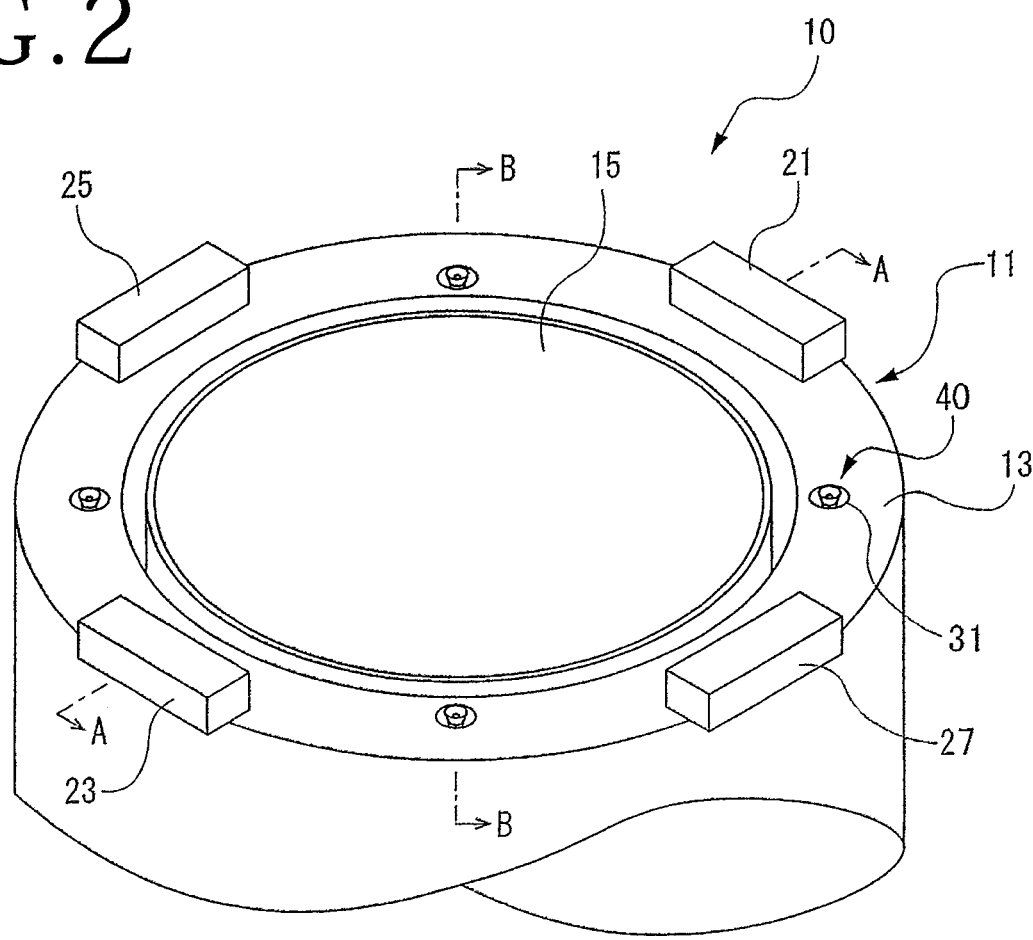
FIG. 2 is a perspective view of a ring frame holding mechanism according to a preferred embodiment of the present invention.

Referring to FIG. 2, a ring frame holding mechanism 10 according to this preferred embodiment is illustrated. The ring frame holding mechanism 10 includes a table 11 for mounting the ring frame 1. The table 11 has a ring-shaped (annular) upper surface 13. A wafer holding table 15 for holding a wafer (not depicted) is provided inside the annular upper surface 13 of the table 11.

A first fixed positioning member 21 and a first movable positioning member 23 opposed to the first fixed positioning member 21 are provided on the upper surface 13 of the table 11. Similarly, a second fixed positioning member 25 and a second movable positioning member 27 opposed to the second fixed positioning member 25 are provided on the upper surface 13 of the table 11.

The direction of opposition of the first fixed positioning member 21 and the first movable positioning member 23 is substantially perpendicular to the direction of opposition of the second fixed positioning member 25 and the second movable positioning member 27. All of the positioning members 21, 23, 25, and 27 are formed as block-shaped members in this preferred embodiment and correspond to positioning means in the present invention.

Figure 3:
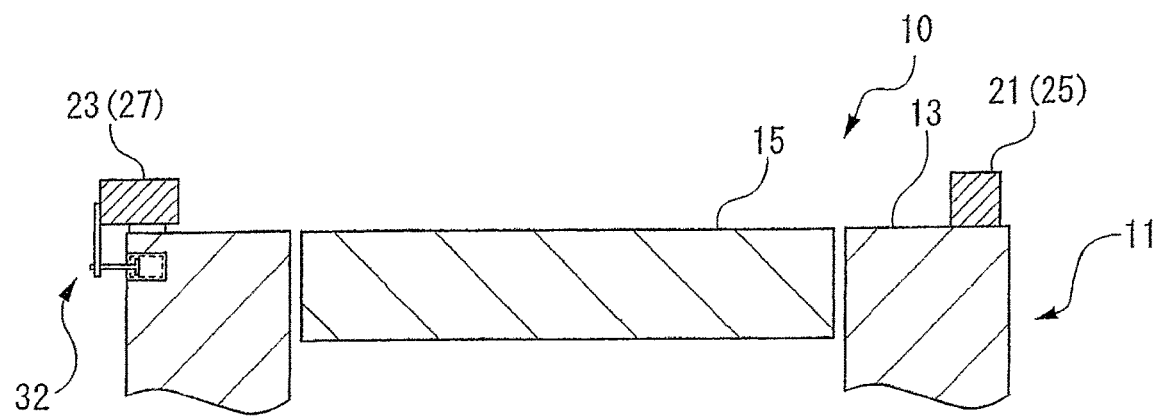
FIG. 3 is a cross section taken along line A-A in FIG. 2.

As depicted in FIG. 3, each of the first movable positioning member 23 and the second movable positioning member 27 is provided with a cylinder mechanism 32. Accordingly, each of the first movable positioning member 23 and the second movable positioning member 27 is movable in the radial direction of the table 11 by the cylinder mechanism 32. In FIG. 2, the cylinder mechanism 32 is not depicted.

In the present embodiment, at least one of the pair of first fixed positioning member 21 and first movable positioning member 23 and the pair of second fixed positioning member 25 and second movable positioning member 27 is adapted to abut against at least one of the pair of first flat surfaces 3 and 5 and the pair of second flat surfaces 7 and 9 of the ring frame 1, thereby setting the ring frame 1 to a target position on the upper surface 13 of the table 11. More specifically, the first fixed positioning member 21 is adapted to abut against the first flat surface 3, and the first movable positioning member 23 is adapted to abut against the first flat surface 5. Similarly, the second fixed positioning member 25 is adapted to abut against the second flat surface 7, and the second movable positioning member 27 is adapted to abut against the second flat surface 9.

Figure 4:
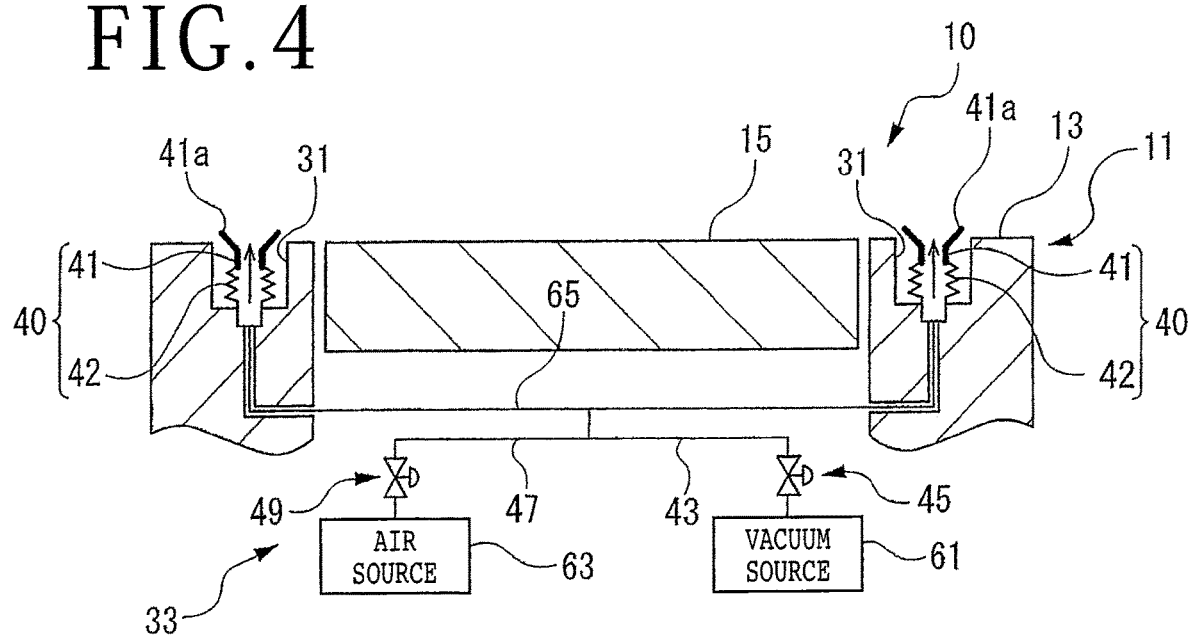
FIG. 4 is a cross section taken along line B-B in FIG. 2.

Further, four recesses 31 are formed on the upper surface 13 of the table 11. Each recess 31 has an upper opening. Each recess 31 is located between any adjacent ones of the four positioning members 21, 23, 25, and 27. As depicted in FIG. 4, a suction member 40 is stored in each recess 31. The suction member 40 is adapted to hold the ring frame 1 under suction. The suction member 40 is included in a suction mechanism 33 depicted in FIG. 4.

That is, the suction mechanism 33 includes four suction members 40 respectively stored in the four recesses 31 of the table 11.

Each suction member 40 has a flexible suction cup 41 and a cylindrical bellows 42 for supporting the suction cup 41. The suction mechanism 33 further includes a suction pipe 43 connected to a vacuum source 61, a first valve 45 provided in the suction pipe 43, an air supply pipe 47 connected to an air source 63, a second valve 49 provided in the air supply pipe 47, and a common passage 65.

The common passage 65 is provided so as to connect the suction pipe 43 and the air supply pipe 47 to the suction cup 41 of each suction member 40 through the cylindrical bellows 42. The suction pipe 43 and the common passage 65 correspond to a suction passage for connecting the suction cup 41 of each suction member 40 to the vacuum source 61. Further, the air supply pipe 47 and the common passage 65 correspond to an air supply passage for connecting the suction cup 41 of each suction member 40 to the air source 63.

Each suction cup 41 has an upper end 41a having a circular inside opening for sucking air and also discharging air. That is, when each suction cup 41 is connected through the cylindrical bellows 42, the common passage 65, and the suction pipe 43 to the vacuum source 61, air is sucked from the opening of the upper end 41a of each suction cup 41, thereby attracting the ring frame 1 to the upper end 41a of each suction cup 41. On the other hand, when each suction cup 41 is connected through the cylindrical bellows 42, the common passage 65, and the air supply pipe 47 to the air source 63, air is discharged from the opening of the upper end 41a of each suction cup 41, thereby separating the ring frame 1 from the upper end 41a of each suction cup 41.

Each cylindrical bellows 42 is stored in the corresponding recess 31. The upper end of each cylindrical bellows 42 is connected to the lower end of the corresponding suction cup 41, and the lower end of each cylindrical bellows 42 is connected to the common passage 65. Each cylindrical bellows 42 has an expandable and contractable structure. Accordingly, when each cylindrical bellows 42 is expanded or contracted, each suction cup 41 is vertically moved in the corresponding recess 31. Each cylindrical bellows 42 is normally in an expanded condition. In this expanded condition of each cylindrical bellows 42, the upper end 41a of each suction cup 41 projects upward from the upper surface 13 of the table 11 as depicted in FIG. 4. That is, the upper end 41a of each suction cup 41 projects upward from the upper opening of the corresponding recess 31. When the upper end 41a of each suction cup 41 is depressed, each cylindrical bellows 42 is contracted by depression force applied to each suction cup 41. As a result, each suction cup 41 is fully stored into the corresponding recess 31.

As described above, the upper end 41a of each suction cup 41 slightly projects upward from the upper surface 13 of the table 11. When the upper end 41a of each suction cup 41 is depressed downward, each suction cup 41 can be fully stored into the corresponding recess 31 by the contraction of each cylindrical bellows 42.

Further, when each cylindrical bellows 42 is connected to the vacuum source 61, the pressure inside each cylindrical bellows 42 is reduced to a vacuum, so that a pressure difference between the vacuum inside each cylindrical bellows 42 and the atmospheric pressure outside each cylindrical bellows 42 is generated. As a result, each cylindrical bellows 42 is contracted by the atmospheric pressure. Accordingly, also in this case, the upper end 41a of each suction cup 41 is fully stored into the corresponding recess 31.

There will now be described a ring frame holding operation by the ring frame holding mechanism 10.

(1) Ring Frame Transferring Step

Figure 5:
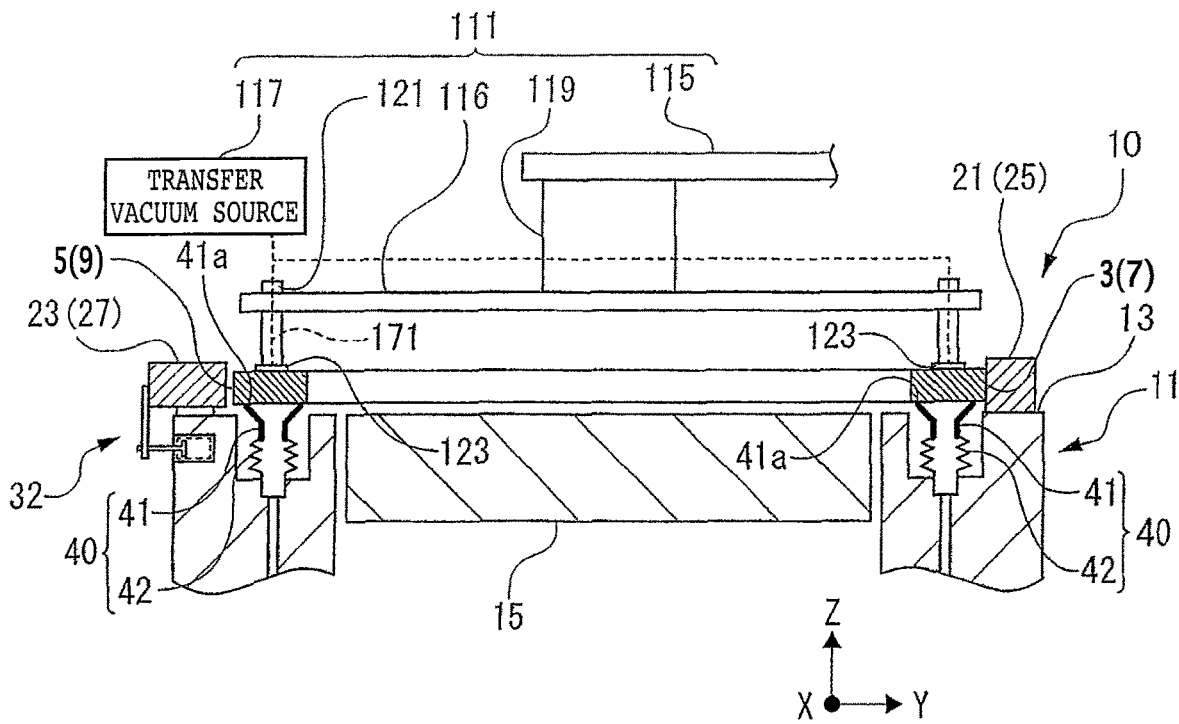
FIG. 5 is a sectional view depicting a ring frame transferring step.

Before starting the operation of the ring frame holding mechanism 10, the ring frame 1 depicted in FIG. 1 is transferred to a predetermined position in the ring frame holding mechanism 10 by using a transfer apparatus 111 depicted in FIG. 5. As depicted in FIG. 5, the transfer apparatus 111 includes a plurality of (e.g., four) holding members 121 for holding the ring frame 1 under suction, a transfer vacuum source 117 for applying a vacuum to each holding member 121, a support portion 116 for supporting all the holding members 121, an arm portion 115 connected to a drive source (not depicted), and a connecting member 119 for connecting the support portion 116 and the arm portion 115.

The arm portion 115 is connected at its base end to the drive source. The holding members 121 are held through the support portion 116 and the connecting member 119 to the front end of the arm portion 115. The arm portion 115 is rotatable about a vertical axis in an XY plane defined by an X direction and a Y direction depicted in FIG. 5, where the axis of rotation of the arm portion 115 coincides with the axis of an output shaft (not depicted) of the drive source. Further, the arm portion 115 is vertically movable in a Z direction depicted in FIG. 5 along the axis of the output shaft of the drive source.

A suction member 123 for holding the ring frame 1 under suction is provided at the lower end of each holding member 121. The suction member 123 is formed of a porous material such as porous ceramic. The transfer vacuum source 117 includes a vacuum generating apparatus and a compressor, for example. A suction passage 171 is connected at its one end to the transfer vacuum source 117. The suction passage 171 extends through the support portion 116 to the suction member 123 of each holding member 121. Accordingly, the transfer vacuum source 117 is connected through the suction passage 171 to each suction member 123. When the transfer vacuum source 117 is operated, a vacuum produced by the transfer vacuum source 117 is applied through the suction passage 171 to the lower surface of each suction member 123, thereby holding under suction the ring frame 1 on the lower surface of each suction member 123.

Figure 6:
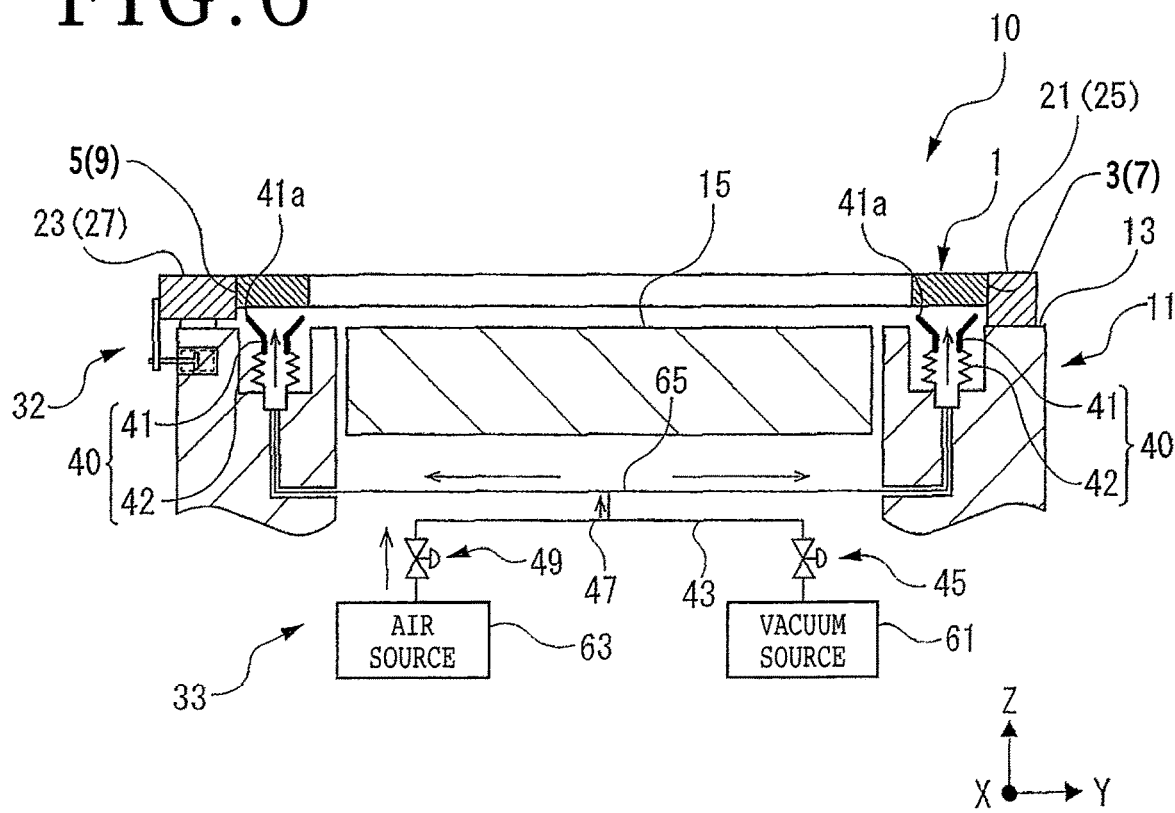
FIG. 6 is a sectional view depicting a floating and positioning step.
Figure 7:
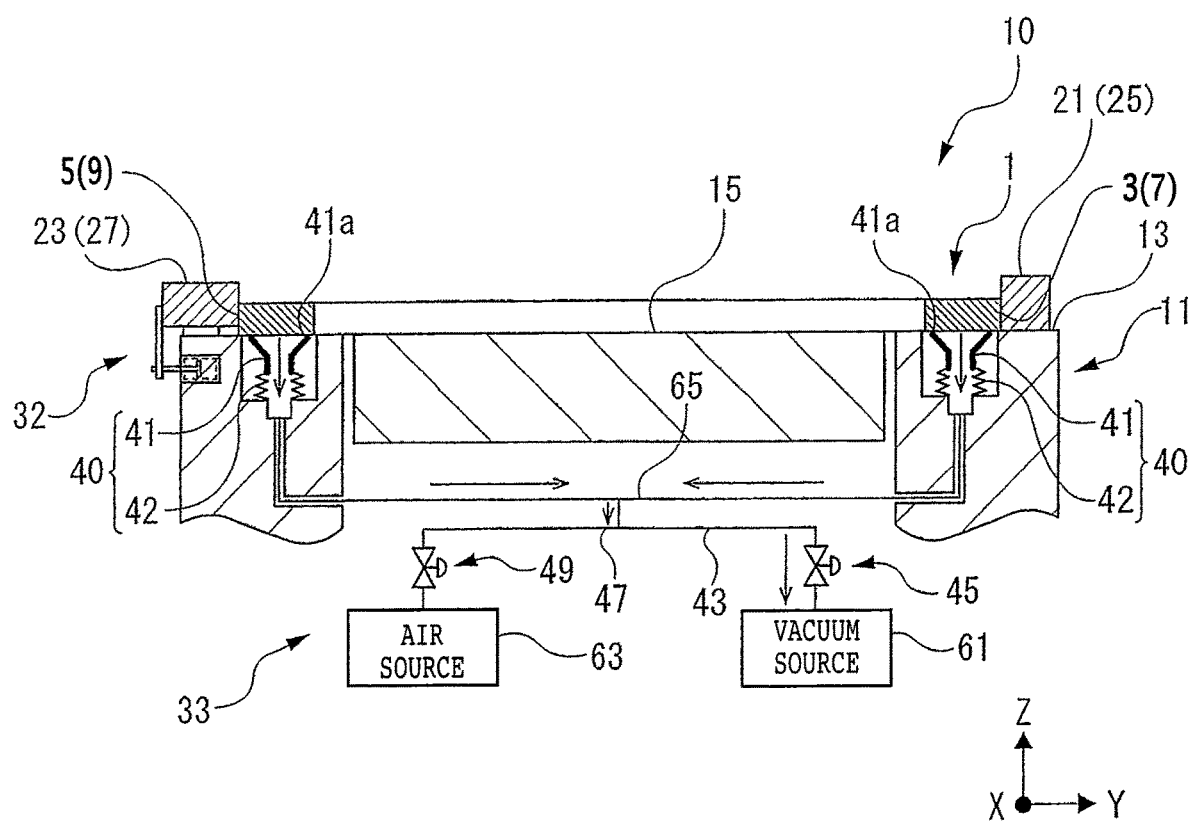
FIG. 7 is a sectional view depicting a holding step.

In FIGS. 5, 6, and 7, the sectional view of the first positioning members 21 and 23 depicted in FIG. 3 and the sectional view of the suction mechanism 33 depicted in FIG. 4 are depicted in combination as one drawing for convenience of illustration.

In the ring frame transferring step, the drive source connected to the arm portion 115 of the transfer apparatus 111 is operated to rotate the arm portion 115 in the XY plane, thereby positioning the holding members 121 above the ring frame 1 placed at a predetermined position. Thereafter, the arm portion 115 is lowered in the Z direction to thereby bring the suction member 123 of each holding member 121 into contact with the upper surface of the ring frame 1. Thereafter, the transfer vacuum source 117 is operated to apply a vacuum to each suction member 123, thereby holding under suction the ring frame 1 on the lower surface of each suction member 123. Further, in this condition, the arm portion 115 is rotated and vertically moved to thereby transfer the ring frame 1 to the position directly above the upper surface 13 of the table 11 in the ring frame holding mechanism 10. Thereafter, the arm portion 115 is lowered to place the ring frame 1 on the upper end 41a of each suction cup 41 of each suction member 40.

In the following embodiment, the arm portion 15 is operated to place the ring frame 1 on the upper end 41a of each suction cup 41 in a condition where the first flat surfaces 3 and 5 of the ring frame 1 are interposed between the first fixed positioning member 21 and the first movable positioning member 23 of the ring frame holding mechanism 10. As a result, the second flat surfaces 7 and 9 of the ring frame 1 are interposed between the second fixed positioning member 25 and the second movable positioning member 27 of the ring frame holding mechanism 10.

(2) Floating and Positioning Step

Next, the ring frame 1 is set to a target position. More specifically, as depicted in FIG. 6, in this step, the first valve 45 is closed and the second valve 49 is opened to thereby connect the suction cup 41 of each suction member 40 through the air supply pipe 47, the common passage 65, and each cylindrical bellows 42 to the air source 63. As a result, air is discharged from each suction cup 41 to thereby float the ring frame 1 over the upper end 41a of each suction cup 41. In FIGS. 6 and 7, arrows depict the flow of air in the suction pipe 43, the air supply pipe 47, the common passage 65, and each cylindrical bellows 42.

The air discharged from each suction cup 41 forms an air layer between the upper surface 13 of the table 11 and the lower surface of the ring frame 1. That is, the ring frame 1 and each suction cup 41 are brought into a noncontact state by this air layer. Further, the upper end 41a of each suction cup 41 is depressed downward by this air layer, so that the upper end 41a of each suction cup 41 becomes flush with the upper surface 13 of the table 11.

In this condition, the positioning members 21, 23, 25, and 27 (see FIG. 2) are operated to position the ring frame 1. More specifically, the first movable positioning member 23 is moved in the radial direction of the table 11 by operating the cylinder mechanism 32 to come into contact with the first flat surface 5 of the ring frame 1 and then move the ring frame 1 in the Y direction as viewed in FIG. 6, thereby interposing the first flat surfaces 3 and 5 between the first fixed positioning member 21 and the first movable positioning member 23. Similarly, the second movable positioning member 27 is moved in the radial direction of the table 11 by operating the cylinder mechanism 32 to come into contact with the second flat surface 9 of the ring frame 1 and then move the ring frame 1 in the X direction as viewed in FIG. 6, thereby interposing the second flat surfaces 7 and 9 between the second fixed positioning member 25 and the second movable positioning member 27. Accordingly, the first flat surface 3 of the ring frame 1 comes into contact with the first fixed positioning member 21, and the second flat surface 7 of the ring frame 1 comes into contact with the second fixed positioning member 25. As a result, the ring frame 1 is set at the target position over the table 11.

(3) Holding Step

Thereafter, the ring frame 1 is held under suction by the ring frame holding mechanism 10. More specifically, as depicted in FIG. 7, in this step, the second valve 49 is closed and the first valve 45 is opened to thereby connect the suction cup 41 of each suction member 40 through the suction pipe 43, the common passage 65, and each cylindrical bellows 42 to the vacuum source 61. Accordingly, the ring frame 1 being floated is placed on the upper end 41a of each suction cup 41. Thereafter, air is sucked from the opening of the upper end 41a of each suction cup 41, so that the ring frame 1 attracted to the upper end 41a of each suction cup 41 under suction is held under suction.

At this time, the upper end 41a of each suction cup 41 is depressed downward by the weight of the ring frame 1. Furthermore, the pressure inside each cylindrical bellows 42 of each suction member 40 is reduced to a vacuum by the communication with the vacuum source 61, thereby producing a pressure difference between the inside and the outside of each cylindrical bellows 42. As a result, each cylindrical bellows 42 is contracted by the atmospheric pressure, so that each suction cup 41 is stored into the corresponding recess 31. Accordingly, the upper end 41a of each suction cup 41 becomes substantially flush with the upper surface 13 of the table 11. Thus, the lower surface of the ring frame 1 is held under suction on the upper end 41a of each suction cup 41 and is also supported on the upper surface 13 of the table 11.

As described above, the ring frame holding mechanism 10 can exhibit the following effect. In positioning the ring frame 1, air is discharged from each suction cup 41 to form an air layer between the upper surface 13 of the table 11 and the lower surface of the ring frame 1. Accordingly, the ring frame 1 is floated over each suction cup 41 by this air layer. That is, the ring frame 1 and each suction cup 41 are brought into a noncontact state. Further, each suction cup 41 is depressed downward by this air layer, so that the upper end 41a of each suction cup 41 becomes flush with the upper surface 13 of the table 11. In this manner, the ring frame 1 can be separated from all the four suction cups 41, so that the ring frame 1 can be easily moved in the radial direction of the table 11 by operating the positioning members 21, 23, 25, and 27. That is, the ring frame 1 can be easily set to a target position, so that the occurrence of improper positioning can be suppressed.

The ring frame holding mechanism 10 can also exhibit the following effect. When the ring frame 1 is held under suction by each suction cup 41, each suction cup 41 is stored into the corresponding recess 31, so that the upper end 41a of each suction cup 41 becomes substantially flush with the upper surface 13 of the table 11. That is, the lower surface of the ring frame 1 is held under suction on the upper end 41a of each suction cup 41 and is also supported on the upper surface 13 of the table 11. Accordingly, in attaching a dicing tape (not depicted) to the upper surface of the ring frame 1 held on the table 11 by using an attaching roller (not depicted), for example, the dicing tape and the ring frame 1 can be sandwiched between the attaching roller and the upper surface 13 of the table 11. As a result, the dicing tape can be attached to the ring frame 1 easily and firmly.

Figure 8:
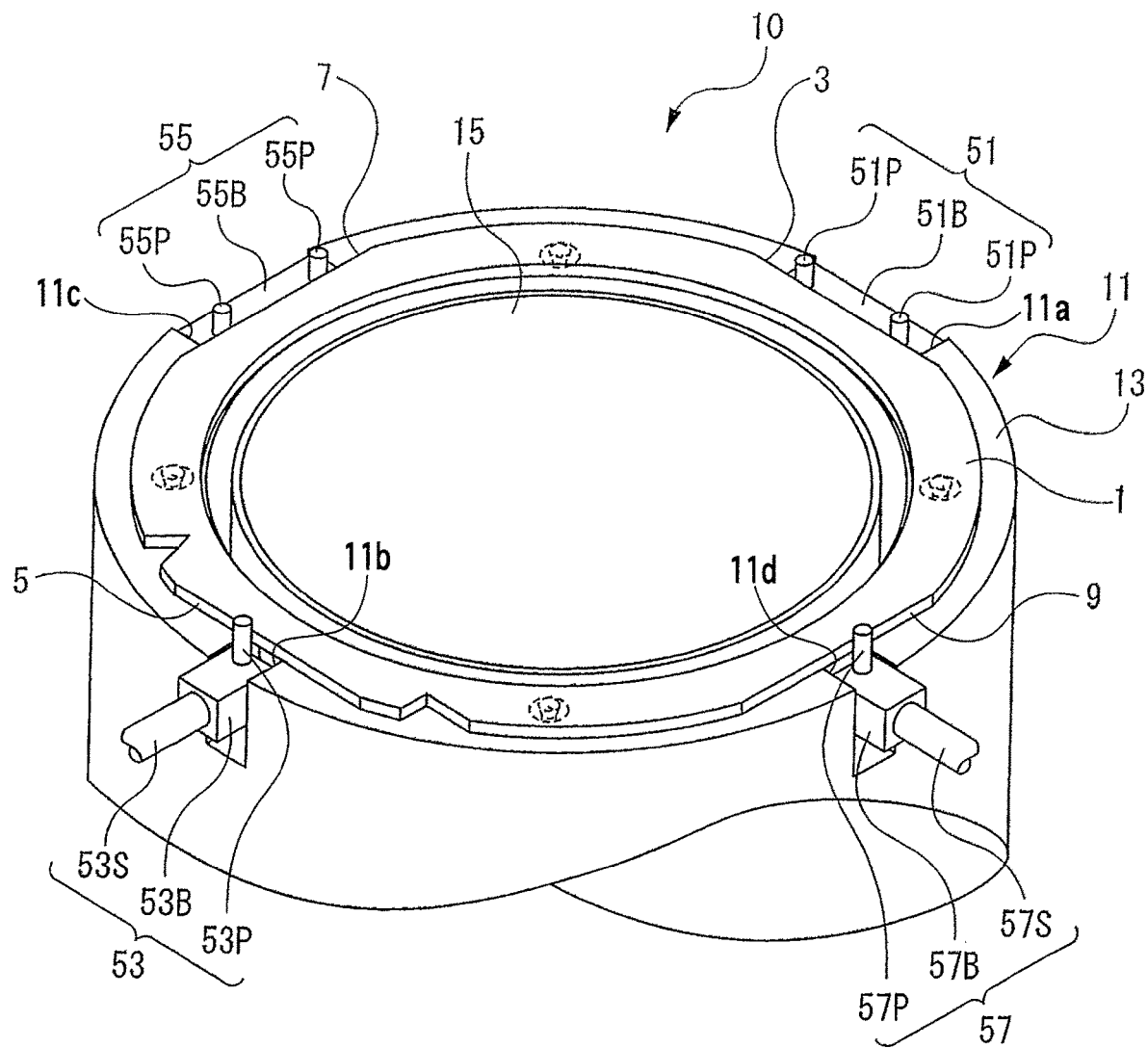
FIG. 8 is a perspective view depicting a modification of positioning means included in the ring frame holding mechanism.

In this preferred embodiment, the table 11 includes the block-shaped positioning members 21, 23, 25, and 27 as positioning means. As a modification, the positioning members 21 to 27 may be replaced by a third fixed positioning member 51, a third movable positioning member 53, a fourth fixed positioning member 55, and a fourth movable positioning member 57 depicted in FIG. 8. The third fixed positioning member 51 is opposed to the third movable positioning member 53. The fourth fixed positioning member 55 is opposed to the fourth movable positioning member 57. The direction of opposition of the third fixed positioning member 51 and the third movable positioning member 53 is substantially perpendicular to the direction of opposition of the fourth fixed positioning member 55 and the fourth movable positioning member 57.

In this configuration, at least one of the pair of third fixed positioning member 51 and third movable positioning member 53 and the pair of fourth fixed positioning member 55 and fourth movable positioning member 57 is adapted to abut against at least one of the pair of first flat surfaces 3 and 5 and the pair of second flat surfaces 7 and 9 of the ring frame 1, thereby setting the ring frame 1 to a target position on the upper surface 13 of the table 11. More specifically, the third fixed positioning member 51 is adapted to abut against the first flat surface 3, and the third movable positioning member 53 is adapted to abut against the first flat surface 5. Similarly, the fourth fixed positioning member 55 is adapted to abut against the second flat surface 7, and the fourth movable positioning member 57 is adapted to abut against the second flat surface 9.

The upper surface 13 of the table 11 is formed with a cutout 11a for mounting the third fixed positioning member 51 and a cutout 11b for mounting the third movable positioning member 53. The third fixed positioning member 51 includes a block-shaped body 51B fixed in the cutout 11a of the table 11 and two pins 51P mounted on the body 51B so as to project from the upper surface of the body 51B. The two pins 51P are adapted to abut against the first flat surface 3 of the ring frame 1. The third movable positioning member 53 includes a block-shaped body 53B movably mounted in the cutout 11b of the table 11, a pin 53P mounted on the body 53B so as to project from the upper surface of the body 53B, and a shaft 53S extending through the body 53B in the radial direction of the table 11. The pin 53P is adapted to abut against the first flat surface 5 of the ring frame 1.

Similarly, the upper surface 13 of the table 11 is further formed with a cutout 11c for mounting the fourth fixed positioning member 55 and a cutout 11d for mounting the fourth movable positioning member 57. The fourth fixed positioning member 55 includes a block-shaped body 55B fixed in the cutout 11c of the table 11 and two pins 55P mounted on the body 55B so as to project from the upper surface of the body 55B. The two pins 55P are adapted to abut against the second flat surface 7 of the ring frame 1. The fourth movable positioning member 57 includes a block-shaped body 57B movably mounted in the cutout 11d of the table 11, a pin 57P mounted on the body 57B so as to project from the upper surface of the body 57B, and a shaft 57S extending through the body 57B in the radial direction of the table 11. The pin 57P is adapted to abut against the second flat surface 9 of the ring frame 1.

All of the bodies 51B, 53B, 55B, and 57B are stored in the cutouts 11a, 11b, 11c, and 11d of the table 11, respectively, so as not to project upward from the upper surface 13 of the table 11. The body 53B of the third movable positioning member 53 is movable along the shaft 53S in the radial direction of the table 11. Similarly, the body 57B of the fourth movable positioning member 57 is movable along the shaft 57S in the radial direction of the table 11.

Figure 9:
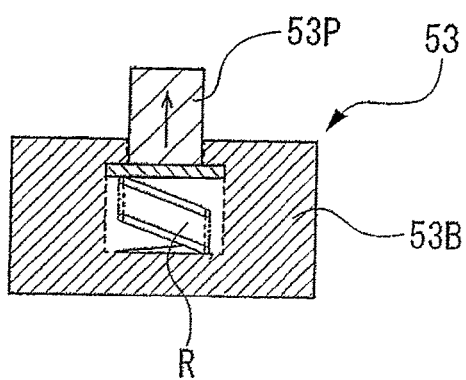
FIG. 9 is a sectional view depicting the structure of the positioning means depicted in FIG. 8.

As depicted in FIG. 9, the pin 53P of the positioning member 53 is vertically movably supported by a spring R stored in the body 53B. Although not depicted, each of the other pins 51P, 55P, and 57P is similarly supported by a spring R. Accordingly, when the pins 51P to 57P are depressed downward against the springs R and are contracted, the pins 51P to 57P are partially stored into the bodies 51B to 57B, respectively.

With this configuration, a dicing tape can be easily attached to the ring frame 1 held under suction on the upper end 41a of each suction cup 41 and also supported on the upper surface 13 of the table 11. Further, the dicing tape can also be easily attached to a wafer (not depicted) held on the wafer holding table 15 (see FIG. 8).

Figure 10:
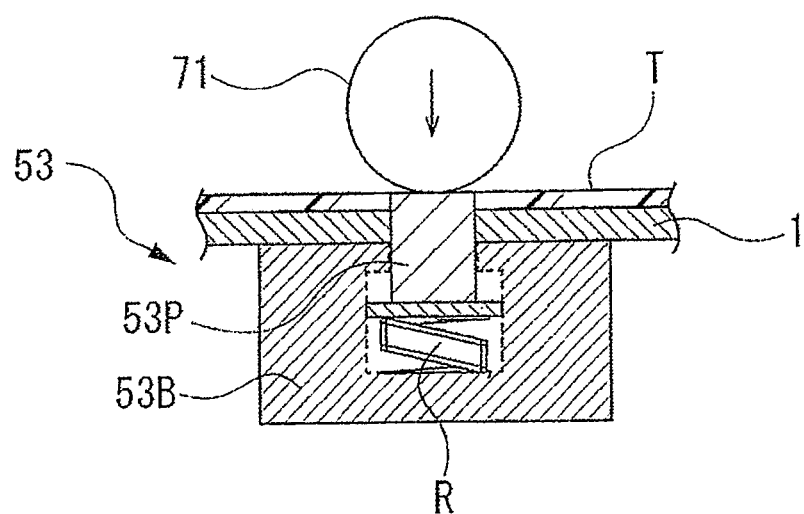
FIG. 10 is a sectional view depicting the operation of the positioning means depicted in FIG. 9.

For example, in the case of attaching a dicing tape T to the ring frame 1 and a wafer (not depicted) as depicted in FIG. 10, the ring frame 1 and the wafer are first covered with the dicing tape T, and an attaching roller 71 is used to apply a pressure to the dicing tape T, thereby attaching the dicing tape T to the upper surface of the ring frame 1 and the upper surface of the wafer.

At this time, when the lower end portion of the attaching roller 71 comes over to the pins 51P to 57P of the positioning members 51 to 57, the pins 51P to 57P are pushed down and contracted by the attaching roller 71 against the springs R, so that the upper end surfaces of the pins 51P to 57P becomes substantially flush with the upper surface of the dicing tape T. Accordingly, it is possible to prevent hindrance of the rotation of the attaching roller 71 by the pins 51P to 57P, so that the dicing tape T can be easily attached to the ring frame 1 and the wafer.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A ring frame holding mechanism for holding a lower surface of a ring frame under suction in a condition where said ring frame is set at a target position by using positioning means, an outer circumference of said ring frame being formed with four flat surfaces including a pair of first flat surfaces opposed in parallel to each other and a pair of second flat surfaces opposed in parallel to each other, a direction of opposition of said first flat surfaces being perpendicular to a direction of opposition of said second flat surfaces, said positioning means being adapted to abut against at least one of said pair of first flat surfaces and said pair of second flat surfaces, said ring frame holding mechanism comprising:

a table having an upper surface for mounting the lower surface of said ring frame, said table including at least one recess formed on the upper surface of said table, said at least one recess having an upper opening;

at least one suction cup provided in said at least one recess so as to be exposed to said upper opening of said at least one recess;

a vacuum source for applying a vacuum to said at least one suction cup;

a suction passage for connecting said at least one suction cup to said vacuum source;

a first valve provided in said suction passage;

an air source for supplying air to said at least one suction cup;

an air supply passage for connecting said at least one suction cup to said air source; and a second valve provided in said air supply passage;

said at least one suction cup having an upper end normally projecting upward from said upper opening of said at least one recess, the upper end of said at least one suction cup capable of being stored into said at least one recess by being depressed downward;

wherein when said first valve is closed and said second valve is opened to supply air from said air source to said at least one suction cup and discharge air from said at least one suction cup, an air layer is formed between the upper surface of said table and the lower surface of said ring frame to thereby bring said ring frame and the upper end of said at least one suction cup into a noncontact state and to also depress the upper end of said at least one suction cup downward, so that the upper end of said at least one suction cup becomes flush with the upper surface of said table, and said ring frame is set to said target position by said positioning means in such a floating condition of said ring frame, and when said second valve is closed and said first valve is opened to apply the vacuum from said vacuum source to said at least one suction cup, said ring frame is held under suction on the upper end of said at least one suction cup.

2. The ring frame holding mechanism according to claim 1, further comprising:

a cylindrical bellows provided in said at least one recess for supporting said at least one suction cup;

wherein when said first valve is opened to hold said ring frame under suction on the upper end of said at least one suction cup, the upper end of said at least one suction cup is depressed downward by the lower surface of said ring frame, and a pressure inside said cylindrical bellows is reduced to a vacuum to produce a pressure difference between a reduced pressure inside said cylindrical bellows and an atmospheric pressure outside said cylindrical bellows, so that said cylindrical bellows is contracted by the atmospheric pressure, and said at least one suction cup is accordingly fully stored into said at least one recess, thereby allowing the upper surface of said table to support the lower surface of said ring frame.

3. The ring frame holding mechanism according to claim 1, wherein said at least one recess includes a plurality of recesses formed on the upper surface of said table, each of said recesses having an upper opening and a suction cup provided in each of said plurality of recesses so as to be exposed to said upper opening of each of said plurality of recesses.

4. The ring frame holding mechanism according to claim 3, further comprising:
   a cylindrical bellows provided in each of said plurality of recesses for supporting each said suction cup;
   wherein when said first valve is opened to hold said ring frame under suction on the upper end of each of said suction cups, the upper end of each of said suction cups being depressed downward by the lower surface of said ring frame, and a pressure inside said cylindrical bellows in each of said plurality of recesses is reduced to a vacuum to produce a pressure difference between a reduced pressure inside said cylindrical bellows and an atmospheric pressure outside said cylindrical bellows, so that said cylindrical bellows is contracted by the atmospheric pressure, and said suction cups are accordingly fully stored into said recesses, thereby allowing the upper surface of said table to support the lower surface of said ring frame.

5. The ring frame holding mechanism according to claim 1, wherein said positioning means includes a first fixed positioning member and a first movable positioning member on said upper surface of said table, wherein said first fixed positioning member and said first movable positioning member are on opposing sides of said upper surface, said first fixed positioning member and said first movable positioning member being configured to engage said pair of first flat surfaces.

6. The ring frame holding mechanism according to claim 5, wherein said
   positioning means further includes a second fixed positioning member and a second movable positioning member on said upper surface of said table, wherein
   said second fixed positioning member and said second movable positioning member are on opposing sides of said upper surface, said second fixed positioning member and said second movable positioning member being configured to engage said pair of second flat surfaces.

* * * * *